(12) United States Patent
Abela et al.

(10) Patent No.: US 6,696,006 B2
(45) Date of Patent: Feb. 24, 2004

(54) MOLD FOR FLASHLESS INJECTION MOLDING TO ENCAPSULATE AN INTEGRATED CIRCUIT CHIP

(75) Inventors: Jonathan Abela, Grenoble (FR); Rémi Brechignac, Grenoble (FR)

(73) Assignee: STMicroelectronics S.A., Montrouge (FR)

(*) Notice: Subject to any disclaimer, the term of this patent is extended or adjusted under 35 U.S.C. 154(b) by 0 days.

(21) Appl. No.: 09/862,983

(22) Filed: May 22, 2001

(65) Prior Publication Data

US 2002/0051832 A1 May 2, 2002

(30) Foreign Application Priority Data

May 22, 2000 (FR) .............................. 00 06514

(51) Int. Cl.⁷ .................. B29C 45/14; B29C 70/72; H01L 21/56
(52) U.S. Cl. .................. 264/272.17; 264/297.2; 264/328.8; 264/328.9; 425/116; 425/129.1; 425/544; 425/572; 425/588; 425/215; 438/127
(58) Field of Search ................ 264/272.15, 272.17, 264/328.8, 328.9, 297.2; 425/116, 125, 127, 129.1, 544, 572, 588, 215; 438/112, 127

(56) References Cited

U.S. PATENT DOCUMENTS

| | | | | |
|---|---|---|---|---|
| 2,583,035 A | * | 1/1952 | Winterhalter | 264/328.8 |
| 3,134,141 A | * | 5/1964 | Hardy | |
| 3,626,051 A | * | 12/1971 | Liautaud | 264/328.8 |
| 3,779,506 A | * | 12/1973 | Adams | 425/572 |
| 3,975,494 A | * | 8/1976 | Tritenne | 264/328.8 |
| 4,012,025 A | * | 3/1977 | Ernst et al. | 425/542 |
| 4,862,586 A | * | 9/1989 | Osada | 264/272.17 |
| 4,867,663 A | * | 9/1989 | Woerner et al. | 425/116 |
| 4,946,633 A | * | 8/1990 | Saeki et al. | 264/272.17 |
| 5,052,907 A | * | 10/1991 | Matumoto et al. | 264/272.17 |
| 5,071,612 A | * | 12/1991 | Obara | 264/272.17 |
| 5,507,633 A | | 4/1996 | Osada et al. | 425/116 |
| 5,834,035 A | | 11/1998 | Osada et al. | 425/116 |
| 6,200,121 B1 | * | 3/2001 | Tsuruta | 264/272.17 |
| 6,355,199 B1 | * | 3/2002 | Briar et al. | 264/272.17 |

FOREIGN PATENT DOCUMENTS

| | | | |
|---|---|---|---|
| DE | 2446863 A1 * | 4/1976 | |
| EP | 0795 901 A2 | 9/1997 | |
| JP | 62221523 A * | 9/1987 | ........... B29C/45/27 |
| JP | 3250635 A * | 11/1991 | |

* cited by examiner

Primary Examiner—Robert B. Davis
(74) Attorney, Agent, or Firm—Lisa K. Jorgenson; Stephen Bongini; Fleit, Kain, Gibbons, Gutman, Bongini & Bianco P.L.

(57) ABSTRACT

An injection mold is provided for injection molding an encapsulation material to encapsulate at least one integrated circuit chip. The injection mold includes at least two parts that define at least one injection circuit, and at least one blind complementary channel communicating with the injection circuit. The injection circuit includes at least one injection cavity for housing the chip, at least one transfer chamber from which the encapsulation material is injected, and at least one injection channel connecting the transfer chamber to the injection cavity. The blind complementary channel is formed between the two parts of the mold and forms at least one appendage of encapsulation material that is connected to the encapsulation material that fills the injection circuit. Also provided is a method for injection molding an encapsulation material to encapsulate at least one integrated circuit chip.

18 Claims, 4 Drawing Sheets

MOLD FOR FLASHLESS INJECTION MOLDING TO ENCAPSULATE AN INTEGRATED CIRCUIT CHIP

CROSS-REFERENCE TO RELATED APPLICATIONS

This application is based upon and claims priority from prior French Patent Application No. 00-06514, filed May 22, 2000, the entire disclosure of which is herein incorporated by reference.

Additionally, this application is related to the application "INJECTION MOLD FOR AN OPTICAL SEMICONDUCTOR PACKAGE AND CORRESPONDING OPTICAL SEMICONDUCTOR PACKAGE," Ser. No. 09/862,984, now pending, which was filed on the same day as the present application and commonly assigned herewith to STMicroelectronics S. A. This related application is herein incorporated by reference.

BACKGROUND OF THE INVENTION

1. Field of the Invention

The present invention relates to semiconductor packages, and more specifically to a mold for the injection molding of an encapsulation material to encapsulate an integrated circuit chip.

2. Description of Related Art

Currently, an injection mold includes two parts which between them define an injection circuit that includes at least one injection cavity intended to house an integrated circuit chip, at least one transfer chamber from which the encapsulation material is injected, and at least one injection channel connecting the transfer chamber to the injection cavity.

During the encapsulation process, due to the effect of the high injection pressure created in the transfer chamber, liquid encapsulation material may seep between the two parts of the mold and out of the injection circuit. Such seepage is greater when the injected encapsulation material is very liquid (for example, when it consists of a molding resin based on an unfilled or lightly filled epoxy). During demolding, the resulting molded part then has "flash", which consists of films of encapsulation material attached to the material that has filled the injection circuit. This flash is particularly irksome when subsequently handling the molded part, because the flash detaches and disintegrates.

The same problem arises when the mold includes at least one insert with a transverse face that partly constitutes the wall of the injection cavity. Here too, encapsulation material can seep between the insert and the mold, so as to also produce flash attached to the material that has filled this cavity. Such flash is particularly irksome when the chip includes a surface provided with an optical sensor and when the flash forms near this face.

SUMMARY OF THE INVENTION

In view of these drawbacks, it is an object of the present invention to overcome the above-mentioned drawbacks and to provide a mold for injection molding an encapsulation material to encapsulate at least one integrated circuit chip. Preferably, the mold includes at least two parts defining at least one injection circuit that includes at least one injection cavity for housing the chip, at least one transfer chamber from which the encapsulation material is injected, and at least one injection channel connecting the transfer chamber to the injection cavity.

One embodiment of the present invention provides an injection mold for injection molding an encapsulation material to encapsulate at least one integrated circuit chip. The injection mold includes at least two parts that define at least one injection circuit, and at least one blind complementary channel communicating with the injection circuit. The injection circuit includes at least one injection cavity for housing the chip, at least one transfer chamber from which the encapsulation material is injected, and at least one injection channel connecting the transfer chamber to the injection cavity. The blind complementary channel is formed between the two parts of the mold and forms at least one appendage of encapsulation material that is connected to the encapsulation material that fills the injection circuit. In a preferred embodiment, the complementary channel extends from the injection channel.

Another embodiment of the present invention provides a method for injection molding an encapsulation material to encapsulate at least one integrated circuit chip. According to the method, a leadframe supporting the chip is placed in an injection mold having at least one injection circuit. The injection circuit of the mold includes at least one injection cavity for housing the chip, at least one transfer chamber from which liquid encapsulation material is injected, and at least one injection channel connecting the transfer chamber to the injection cavity. The liquid encapsulation material is injected into the injection cavity via the injection channel so that the liquid encapsulation material fills the cavity and at least one blind complementary channel of the injection mold that communicating with the injection circuit. The liquid encapsulation material is hardened so as to form a molded part that includes an integrated circuit package corresponding to the injection cavity and at least one complementary branch of encapsulation material corresponding to the at least one blind complementary channel, with the complementary branch of encapsulation material being connected to the hardened encapsulation material filling the injection circuit. In one preferred method, the complementary channel connects two injection channels of the mold that are connected to the transfer chamber.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Embodiments of the present invention provide a mold for injection molding an encapsulation material to encapsulate at least one integrated circuit chip. The mold includes at least two parts defining at least one injection circuit that includes at least one injection cavity for housing the chip, at least one transfer chamber from which the encapsulation material is injected, and at least one injection channel connecting the transfer chamber to the injection cavity. Additionally, the mold includes at least one blind complementary channel that is formed between the two parts of the mold and communicates with the injection circuit. The complementary channel forms at least one appendage that is connected to the encapsulation material filling the injection circuit.

In some embodiments of the present invention, the complementary channel extends from the injection channel, and preferably connects two injection channels that are connected to the transfer chamber. In further embodiments, the complementary channel extends from the transfer chamber. In still other embodiments of the present invention, the complementary channel extends from the cavity. In one embodiment, the complementary channel extends around an insert of the mold, one face of which partly constitutes the wall of the cavity so as to form an annular space communicating with the cavity. Preferably, that part of the annular space that is remote from the cavity is enlarged.

Figure 1:
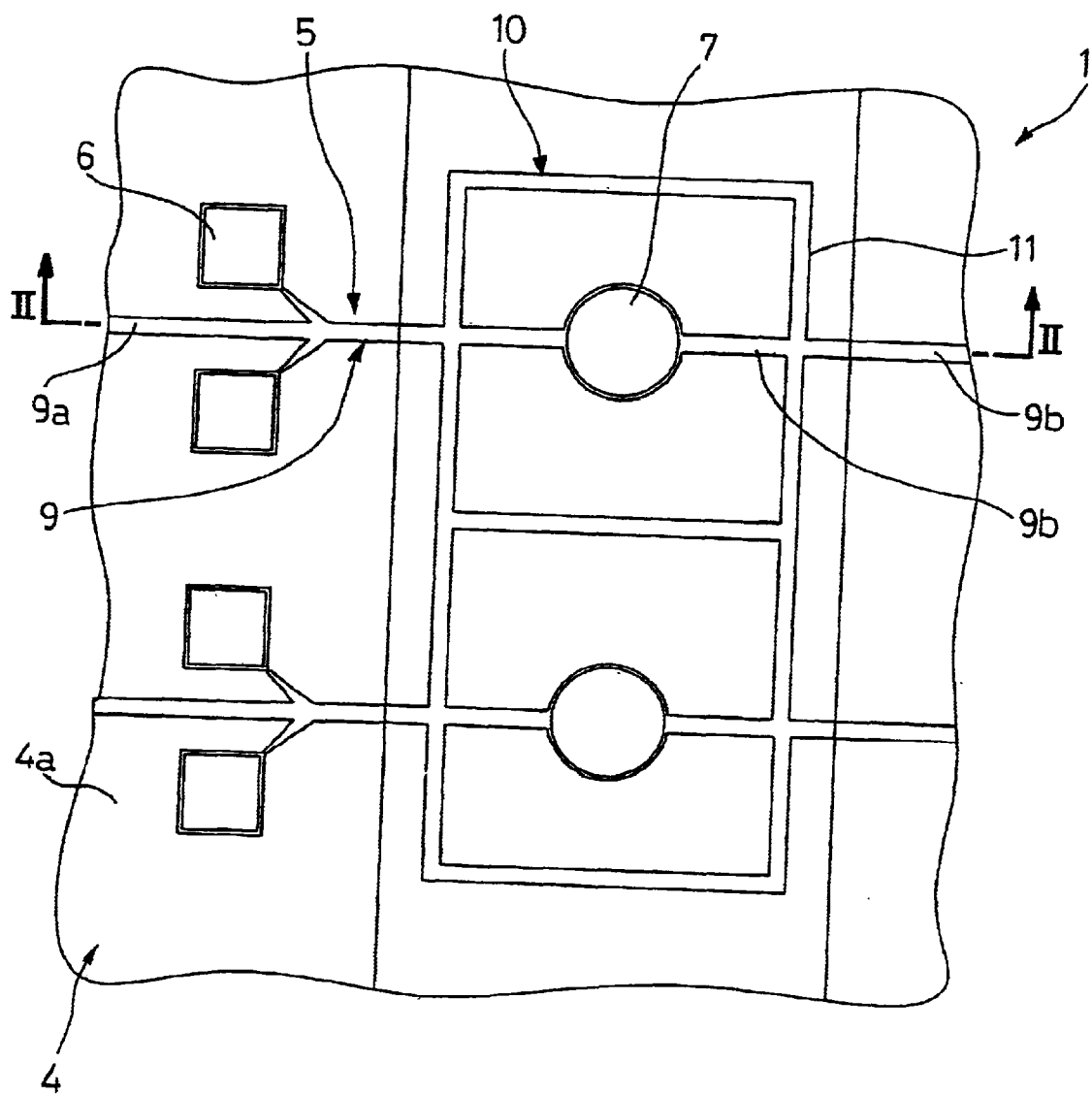
FIG. 1 shows a top view of part of an injection mold according to one embodiment of the present invention.
Figure 2:
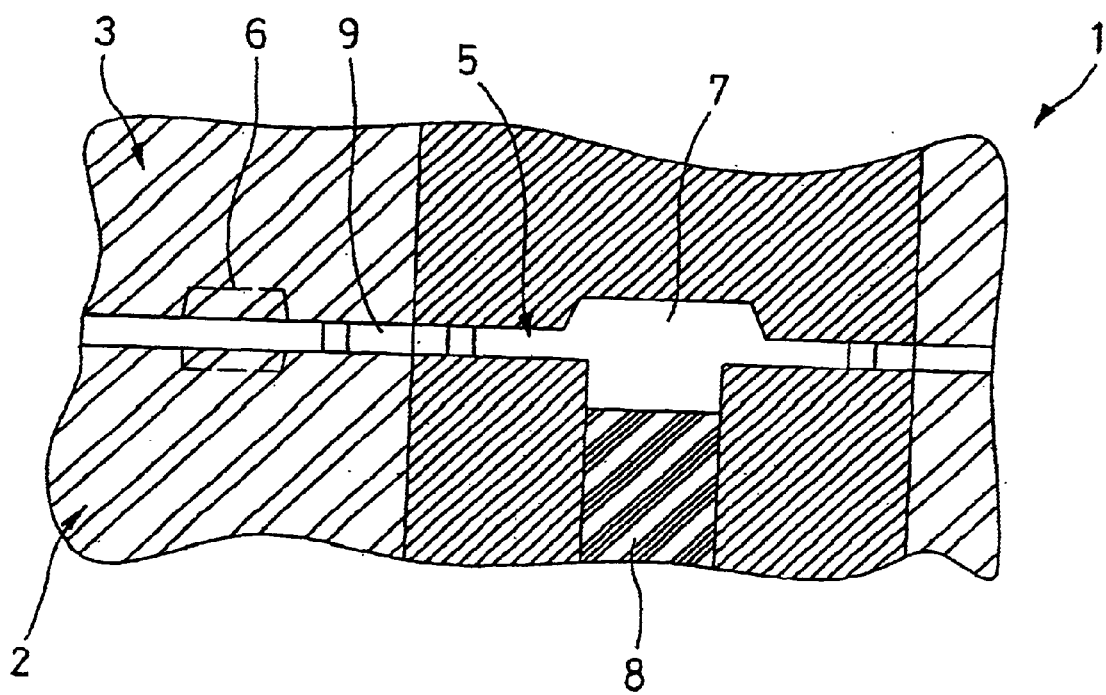
FIG. 2 shows a cross section of the injection mold taken along line II—II of FIG. 1.

The present invention will be more clearly understood from the following description of molds for injection molding an encapsulation material for encapsulating an integrated circuit chip that is supported by a leadframe. FIGS. 1 and 2 show an injection mold according to one embodiment of the present invention. As shown, the injection mold 1 includes a lower part 2 and an upper part 3 that are joined together so as to present a horizontal parting line 4. In a conventional manner, the faces of the two parts 2 and 3 of the mold 1 that constitute this parting line 4 are hollowed out so as to form injection circuits 5.

The injection circuits 5 include injection cavities 6, transfer chambers 7 that are provided with injection pistons 8, and injection channels 9 which connect the transfer chambers 7 to the cavities 6 and which consist of grooves made in the two parts 2 and 3 of the injection mold 1. In the embodiment shown in FIGS. 1 and 2, each injection chamber 7 communicates with two opposed straight injection channels 9a and 9b, which each communicate with cavities 6 formed on each side of the channel.

The injection mold 1 furthermore includes blind complementary channels which communicate with the injection circuits 5. As may be more particularly seen in FIG.1, the mold 1 has complementary channels 11 which are formed by grooves made in the faces of the two parts 2 and 3 of the parting line 4 and which extend around and some distance from the transfer chamber 7. These complementary channels communicate, on each side of the transfer chamber, with the injection channels 9a and 9b.

In order to produce the molded part 12 shown in FIG. 3 leaving the injection mold 1, the preferred procedure is as follows. With the two parts 2 and 3 of the mold separated, a leadframe 13 is deposited on region 4a of the parting line 4 of the lower part 2, in which the cavities 6 are provided, in such a way that the integrated circuit chips 14 carried by the leadframe are placed at the centers of the cavities 6. Solid pellets of encapsulation material are placed above the pistons 8 in the injection chambers 7 of the lower part 2 of the mold 1.

The mold 1 is then closed so that the leadframe 13 is held in a sealed manner between the two parts 2 and 3 of the mold. With the pellets being melted by heating the mold 1, the pistons 8 are activated and compress the encapsulation material in the liquid state and inject it into the cavities 6 via the injection channels 9. The liquid encapsulation material fills the complementary channels 10 at the same time. The encapsulation material is then cooled through the mold 1 so that it resumes the solid state.

Figure 3:
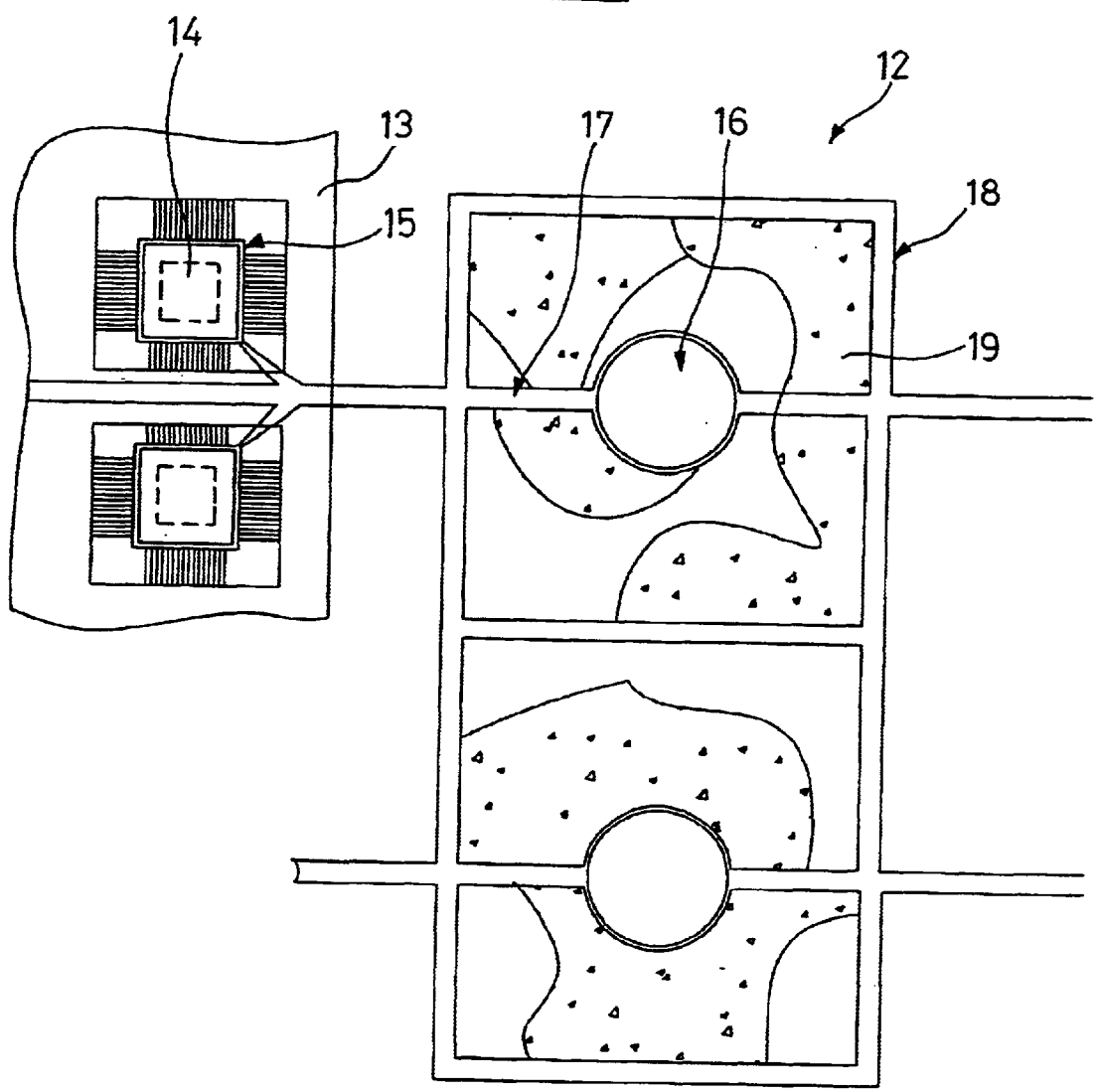
FIG. 3 shows a partial top view of an injection-molded part leaving the injection mold of FIG. 1.

As shown in FIG. 3, the resulting molded part 12 that comes out of the injection mold 1 includes integrated circuit packages 15 corresponding to the cavities 6, discs 16 corresponding to the transfer chamber 7, branches 17 corresponding to the injection channels 9, and complementary branches 18 corresponding to the complementary channels 10.

On account of the high injection pressure, liquid encapsulation material can seep between the two parts 2 and 3 of the mold 1 from the injection circuit 5. Such seepage forms flash 19 on the resulting molded part 12, with the flash being in the form of films of encapsulation material which are attached not only to the disc 16 and to the branches 17 but also to the complementary branches 18. On account of the positioning of the holding means that holds the two parts 2 and 3 of the injection mold 1 together, the flash 19 is liable to form essentially in the spaces bounded by the complementary channels 18 around the discs 16. Consequently when handling the resulting molded part 12, the flash 19 is retained all around it and does not break up.

Figure 4:
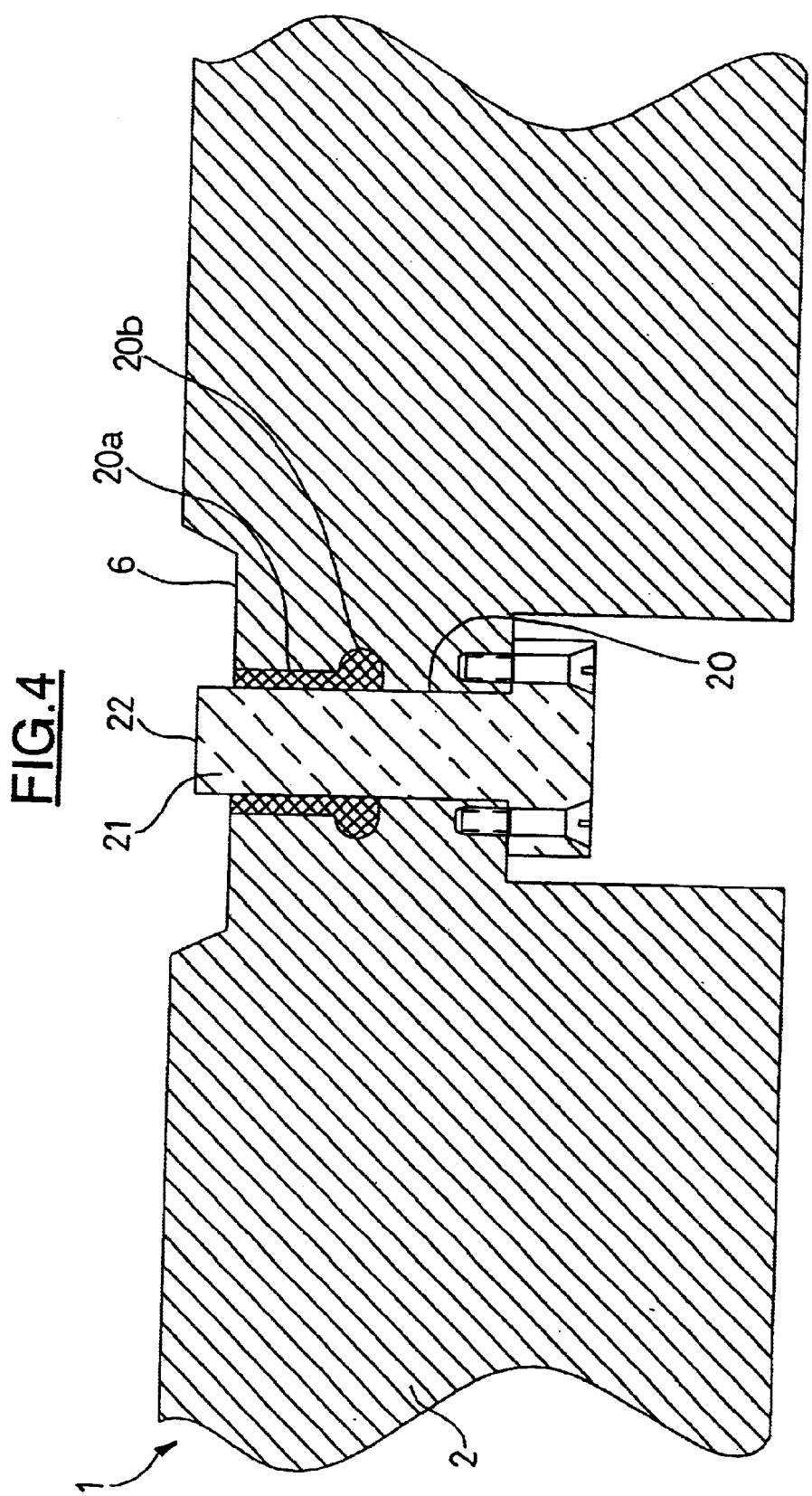
FIG. 4 shows a cross section of a part of an injection mold according to another embodiment of the present invention.

FIG. 4 shows a cross section of part of an injection mold according to another embodiment of the present invention. As shown, in this embodiment the lower part 2 of the mold 1 is modified by the presence of passages 20 that are perpendicular to the parting line 4 and emerge at the center of the cavities 6. Fitted into these passages 20 are inserts 21 whose front parts 22 protrude slightly into the cavities 6 and constitute part of the wall of these cavities. The front parts of the passages 20 that house the inserts 21 are enlarged so as to create blind complementary channels formed by annular spaces 20a emerging in the cavities 6 and having annular grooves 20b in their part furthest away from the cavities 6.

During the manufacture of a first molded part 12 in the mold 1 of FIG. 4, the annular spaces 20a and the grooves 20b fill with the injected encapsulation material. On demolding this first molded part, the material injected into the annular spaces 20a and the grooves 20b, which projects from the package 15, breaks at the surface of the package and remains in the annular space 20a and the grooves 20b, which hold the material in place. In the regions of the inserts 21, the packages 15 of the resulting molded part 12 do not normally have any flash.

Thus, the injected encapsulation material remaining in the annular spaces 20a and the grooves 20b constitute plugs between the lower part 2 of the mold 1 and the inserts 21 which it supports, such that when subsequently molding other molded parts 12, no flash forms on their packages 15.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. An injection mold for injection molding an encapsulation material to encapsulate at least one integrated circuit chip, said injection mold comprising:
   at least two parts that define at least one injection circuit formed between the two parts
      and in at least one of the parts, the injection circuit including: at least one injection cavity for housing the chip;
      at least one transfer chamber from which the encapsulation material is injected; and
      at least one injection channel formed in a parting line or plane of the mold, the at least one injection channel connecting the transfer chamber to the injection cavity; and
   at least one blind complementary channel formed between the two parts of the mold and in at least one of the parts, the blind complementary channel directly communicating with the injection channel at some distance from the injection cavity and the transfer chamber such that the blind complementary channel causes the formation of at least one appendage of encapsulation material that is connected to the encapsulation material that fills the injection channel, so that if during injection molding flash is formed between the two parts of the mold in its parting line or plane, then after demolding such flash stays attached to at least the encapsulation material that filled the injection channel and the blind complementary channel,
   wherein the at least one blind complementary channel is not directly connected to any injection cavity of the injection circuit so as to not directly communicate with any injection cavity of the injection circuit.

2. The injection mold according to claim 1, wherein the complementary channel extends from the injection channel.

3. The injection mold according to claim 2, wherein the complementary channel connects two injection channels that are connected to the transfer chamber, and extends some distance from the transfer chamber.

4. The injection mold according to claim 1, wherein the complementary channel connects two injection channels, the two injection channels being connected to the transfer chamber.

5. An injection mold for injection molding an encapsulation material to encapsulate at least one integrated circuit chip, said injection mold comprising:
   at least two parts that define a least one injection circuit formed between the two parts and in at least one of the parts, the injection circuit including:
      at least one injection cavity for housing the chip;
      at least one transfer chamber from which the encapsulation material is injected; and
      at least one injection channel formed in a parting line or plane of the mold, the at least one injection channel connecting the transfer chamber to the injection cavity; and
   at least one blind complementary channel formed between the two parts of the mold and in at least one of the parts, the blind complementary channel directly communication with the injection channel at some distance from the injection cavity and the transfer chamber such that the blind complementary channel causes the formation of at least one appendage of encapsulation material that is connected to the encapsulation material that fills the injection channel, so that if during injection molding flash is formed between the two parts of the mold in its parting line or plane, then after demolding such flash stays attached to at least the encapsulation material that filled the injection channel and the blind complementary channel,
   wherein the at least one blind complementary channel includes a first blind complementary channel, a second blind complementary channel, and a third blind complementary channel, and
   the third blind complementary channel connects the first and second blind complementary channels.

6. The injection mold according to claim 5, wherein the at least one blind complementary channel also directly communicates with the transfer chamber.

7. The injection mold according to claim 5, wherein the at least one blind complementary channel also directly communicates with the injection cavity.

8. An injection mold for injection molding an encapsulation material to encapsulate at least one integrated circuit chip, said injection mold comprising:
   at least two parts that define least one injection circuit, the injection circuit including:
      at least one injection cavity for housing the chip;
      at least one transfer chamber from which the encapsulation material is injected; and
      at least one injection channel connecting the transfer chamber to the injection cavity;
   at least one blind complementary channel communicating with the injection circuit, the blind complementary channel being formed between the two parts of the mold and forming at least one appendage of encapsulation material that is connected to the encapsulation material that fills the injection circuit; and
   an insert having one face that partly constitutes the wall of the injection cavity,
   wherein the complementary channel extends around the insert so as to form an annular space communicating with the injection cavity.

9. The injection mold according to claim 8, wherein a part of the annular space that is remote from the cavity is enlarged.

10. A method for injection molding an encapsulation material to encapsulate at least one integrated circuit chip, said method comprising the steps of:
   placing a leadframe supporting the chip in an injection mold having at least one injection circuit formed between two parts of the mold and in at least one of the parts, the injection circuit including at least one injection cavity for housing the chip, at least one transfer chamber from which liquid encapsulation material is injected, and at least one injection channel formed in a parting line or plane of the mold and connecting the transfer chamber to the injection cavity;
   injecting the liquid encapsulation material into the injection cavity via the injection channel so that the liquid encapsulation material fills the cavity and at least one blind complementary channel of the injection mold, the blind complementary channel formed between the two parts of the mold and in at least one of the parts, and directly communicating with the injection channel at some distance from the injection cavity and the transfer chamber, and the at least one blind complementary channel being not directly connected to any injection cavity of the injection circuit so as to not directly communicate with any injection cavity of the injection circuit; and
   hardening the liquid encapsulation material so as to form a molded part that includes an integrated circuit package corresponding to the injection cavity and at least one complementary branch of encapsulation material corresponding to the at least one blind complementary channel, the complementary branch of encapsulation material being connected to the hardened encapsulation material filling the injection channel so that if flash was formed between the two parts of the mold in its parting line or plane, then after demolding such flash stays attached to at least the encapsulation material that filled the injection channel and the complementary branch of encapsulation material.

11. The method according to claim 10, wherein the complementary channel extends from the injection channel.

12. The method according to claim 10, wherein the complementary channel connects two injection channels of the mold, the two injection channels being connected to the same transfer chamber.

13. The method according to claim 10, wherein the complementary channel also directly communicates with the transfer chamber.

14. The injection mold according to claim 1, wherein the blind complementary channel is a means for forming complementary attachment means for flash that is formed during injection molding.

15. The injection mold according to claim 1, wherein the complementary channel connects two injection channels that are connected to the same transfer chamber.

16. The injection mold according to claim 1, wherein the at least one blind complementary channel is not directly connected to any transfer chamber of the injection circuit so as to not directly communicate with any transfer chamber of the injection circuit.

17. The injection mold according to claim 16, wherein the blind complementary channel is a means for forming complementary attachment means for flash that is formed during injection molding, an has no function in injecting the encapsulation material into the injection cavity to encapsulate the integrated circuit chip.

18. The injection mold according to claim 5, wherein the first and second blind complementary channels each connect two injection channels of the mold.

* * * * *